United States Patent
Aydelott et al.

[19]

[11] Patent Number: 6,106,611
[45] Date of Patent: Aug. 22, 2000

[54] INSULATING AND WARMING SHIELD FOR A SEED CRYSTAL AND SEED CHUCK AND METHOD FOR USING THE DEVICE

[75] Inventors: Richard M. Aydelott, Ridgefield; Clifford W. Groat, Vancouver, both of Wash.

[73] Assignee: SEH-America, Inc., Vancouver, Wash.

[21] Appl. No.: 09/415,460

[22] Filed: Oct. 14, 1999

Related U.S. Application Data

[62] Division of application No. 09/166,957, Oct. 6, 1998.

[51] Int. Cl.$^7$ .................................................... C30B 15/20
[52] U.S. Cl. ............................. 117/13; 117/248; 117/911
[58] Field of Search .................................. 117/13, 14, 15, 117/218, 911

[56] References Cited

U.S. PATENT DOCUMENTS

| | | | |
|---|---|---|---|
| 4,738,832 | 4/1988 | Drechseh | 117/218 |
| 5,759,261 | 6/1998 | Dornberger et al. | |

FOREIGN PATENT DOCUMENTS

| | | |
|---|---|---|
| 0 769 577 A2 | 4/1997 | European Pat. Off. . |
| 0 783 047 A1 | 7/1997 | European Pat. Off. . |
| 0 792 953 A1 | 9/1997 | European Pat. Off. . |
| 229 722 A1 | 11/1985 | Germany . |
| 58-50959 | 11/1983 | Japan . |
| 61-10098 | 1/1986 | Japan . |
| 63-156092 | 6/1988 | Japan . |
| 63-277589 | 11/1988 | Japan . |
| 63-288987 | 11/1988 | Japan . |
| 63-295494 | 12/1988 | Japan . |
| 1-290584 | 11/1989 | Japan . |
| 4-240183 | 8/1992 | Japan . |
| 6-116085 | 4/1994 | Japan . |

OTHER PUBLICATIONS

E. Mendel et al., "Seed Holder for Crystal Growth", *IBM Technical Disclosure Bulletin*, Oct. 1974, vol. 17, No. 5, p. 1353.

*Primary Examiner*—Felisa Hiteshew
*Attorney, Agent, or Firm*—Oliff & Berridge, PLC

[57] ABSTRACT

A seed chuck for supporting a seed crystal for dipping in a hot melt has a main body including a dipping support formation for connection to a dipping apparatus and a seed support formation for supporting a seed crystal. A shield is coupled to the main body that insulates the seed crystal from cooling and heats the seed crystal with radiant energy emitted from the hot melt. The shield can be in the form of an insulating layer disposed against or inside of a portion of the seed chuck. In this case, the seed crystal is insulated from the cooler seed chuck and allowed to be warmed by the hot melt. The shield can also be a removable flange extending outwardly from the seed chuck and having an inverted cup shape or parabolic umbrella shape. In this case, the shield prevents cooling external gas flow from reaching the seed crystal while capturing and directing heat radiating from the hot melt onto the seed crystal. A method of warming the seed crystal during a growth process in which the a portion of the seed crystal is dipped in a hot melt includes providing a hot melt consisting of a molten mass of material, supporting the seed crystal in a seed chuck for selectively lowering the seed crystal into the hot melt, and warming the seed crystal supported in the seed chuck by using heat radiating from the hot melt and by insulating the seed crystal from external cooling forces.

6 Claims, 3 Drawing Sheets

INSULATING AND WARMING SHIELD FOR A SEED CRYSTAL AND SEED CHUCK AND METHOD FOR USING THE DEVICE

This is a Division of application Ser. No. 09/166,957 filed Oct. 6, 1998. The entire disclosure of the prior application is hereby incorporated by reference herein in its entirety.

BACKGROUND OF THE INVENTION

1. Field of Invention

The invention relates to seed crystals and the seed chucks used to hold the seed crystals during growth. More particularly, the invention relates growing dislocation-free (DF) crystals.

2. Description of Related Art

The monocrystalline silicon that is the starting material for many semiconductor electronic components is commonly prepared by a Czochralski (CZ) process. In this process, pieces of polycrystalline silicon are placed in a crucible and melted to a liquidous state, thereby creating a melt. A seed crystal having the desired monocrystalline atomic structure is then lowered into contact with the molten silicon. As the seed crystal is slowly extracted from the melt, a monocrystalline crystal is drawn from the melt having the same atomic structure as the seed crystal. One such type of crystal pulling apparatus is disclosed in EP 783 047, which is incorporated by reference herein.

Unfortunately, dislocation defects are generated in the seed crystal due to thermal shock as the seed crystal contacts the relatively hot melt. If corrective actions are not taken, the dislocation defects propagate through and multiply in the growing crystal. As known to those skilled in the art, dislocations generally propagate along crystallographic planes. For a silicon seed crystal having a <100> orientation, the dislocations typically propagate along a plane that extends at an angle of 55° from the longitudinal axis of the crystal.

In order to terminate the dislocations prior to propagation through the main body of the crystal, crystals typically have a neck section extending between the seed crystal and the main body of the crystal. The most common method of eliminating dislocations is known as the Dash method and involves growing a neck having a relatively small diameter and a relatively long length. For example, a neck grown according to the Dash method may have a diameter of between 2 mm and 4 mm and a length between 30 mm and 200 mm. As the neck is grown, the dislocations propagate through the neck toward the interface of the seed crystal and the melt. As a result of the extended length and small diameter of the neck, however, the dislocations terminate at the exterior surface of the neck such that the main body of the crystal is dislocation-free (DF). The crystal is then expanded in diameter through the shoulder portion to the DF main body. Since there is no easy and reliable method to determine if the dislocations have been terminated, the Dash method generally requires the neck to have a relatively small diameter and an extended length in order to effectively terminate most, if not all, dislocations.

Although the Dash method is widely utilized, the Dash method has several significant disadvantages. For example, the time and expense associated with growing the neck section are non-recoverable since the neck is ultimately discarded as waste. Also, since the entire crystal is supported during growth by the relatively thin neck section, the maximum mass of a crystal is limited, typically to approximately 140 kg. Although this weight limit poses productivity and economic problems for crystals having conventional diameters of 150 mm or 200 mm, even more problems are created by this weight limit as the silicon industry begins to investigate and grow crystals having diameters of 300 mm or more.

To reduce the thermal shock, dipping speed has also been carefully controlled. Often the seed crystal will be lowered toward the melt and held slightly above the melt until the temperature of the seed crystal stabilizes. Such delay reduces efficiency and adds significant time to the process. Further external gases flowing toward the seed crystal cool the seed crystal, thus making it difficult to stabilize the temperature of the seed crystal.

Therefore, notwithstanding prior technique to grow DF crystals, a need still exists for an improved technique for growing DF crystals. In particular, a need exists for improved techniques for growing relatively large and heavy DF crystals without subjecting the neck of the crystal to excessive force and without repeatedly adjusting the pulling speed or requiring additional equipment for lifting or otherwise supporting the crystal during growth.

SUMMARY OF THE INVENTION

One aspect of the invention is to reduce or eliminate dislocations in seed crystals during growth.

Another aspect of the invention is to provide seed chucks that warm and insulate the seed crystals to thermally isolate or create a thermal barrier during growth in order to reduce thermally induced stress dislocations.

A further aspect of the invention is to warm and insulate the seed crystals using the seed chuck without the addition of external warming devices.

An additional aspect of the invention is to provide a method of growing seed crystals that have reduced or no dislocations.

Another aspect of the invention is to control the energy of the melt to warm the seed crystal by collecting and focusing emissive, reflective and conductive thermal energy of the melt and shield or redirect external gas flow from the seed crystal.

The invention is directed to a seed chuck for supporting a seed crystal for dipping in a hot melt. The seed chuck has a main body including a dipping support formation for connection to a dipping apparatus and a seed support formation for supporting a seed crystal. A shield is coupled to the main body that insulates the seed crystal from cooling and heats the seed crystal with radiant energy emitted from the hot melt.

The shield may be in the form of an insulating layer disposed against the main body of the seed chuck. The shield may also be a hollow portion of the seed chuck attached to the main body and having insulating material disposed therein. The shield may be insulating inserts disposed between the seed crystal and the seed chuck to thermally isolate the seed crystal. In this case, the seed crystal is insulated from the cooler seed chuck and allowed to be warmed by the hot melt.

The shield may also be a removable flange extending outwardly from the seed chuck. The flange may have an inverted cup shape or parabolic umbrella shape. The curve of the flange may be varied depending on where the heat radiating from the hot melt is desired to be reflected onto the seed crystal. The shield contains the heat radiating from the hot melt and concentrates the radiation in the area surrounding the seed crystal. The inner surface of the shield facing the seed crystal may be coated with a reflective coating to increase efficiency. The shield in this case may also be insulated or made of insulating material. Thus, the shield prevents cooling external gas flow from reaching the seed crystal while capturing and directing heat radiating from the hot melt onto the seed crystal.

The method of warming the seed crystal during a growth process in which the a portion of the seed crystal is dipped in a hot melt includes providing a hot melt consisting of a molten mass of material, supporting the seed crystal in a seed chuck for selectively lowering the seed crystal into the hot melt, and warming the seed crystal supported in the seed chuck by using heat radiating from the hot melt and by insulating the seed crystal from external cooling forces.

Other aspects, advantages and salient features of the invention will become apparent from the following detailed description, which taken in conjunction with the annexed drawings, disclosed preferred embodiments of the invention.

BRIEF DESCRIPTION OF THE DRAWINGS

Referring to the drawings that form a part of this original disclosure.

DETAILED DESCRIPTION OF PREFERRED EMBODIMENTS

Figure 1:
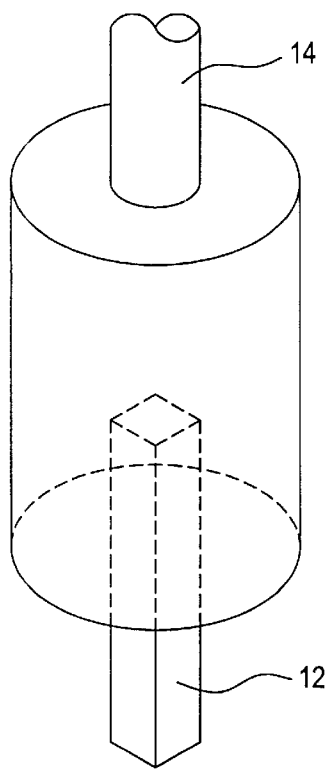
FIG. 1 is a side perspective view of a conventional seed check for holding a seed crystal during dipping into a melt.

The invention is described with reference to the accompanying drawings, in which preferred embodiments of the invention are shown. The invention may, however, be embodied in many different forms and should not be considered as limited to the embodiment set forth herein. Rather, the embodiments are provided so that this disclosure will be thorough and complete and fully convey the scope of the invention to those skilled in the art. Like reference numerals refer to like elements throughout.

Referring to FIG. 1, a prior art seed chuck 10 is shown for supporting a silicon seed crystal 12 on one end and having an attachment member 14 on the opposite end for attachment to a crystal pulling apparatus. As is conventionally known, the crystal pulling apparatus lowers the seed chuck 10 holding seed crystal 12 into a hot melt, such as a bath of molten silicon, during a crystal growth process. The seed crystal 12 is initially lowered to a position spaced from but near the surface of the melt. The seed crystal is then held in this position to warm it by thermal convection from the melt until the seed crystal 12 stabilizes to a temperature near the temperature of the melt. As the seed crystal is lowered farther to contact the melt, heat transfer within the seed crystal changes from convection to conduction. The change in heat transfer causes a thermal shock which quickly raises the temperature of the entire seed crystal.

Figure 2:
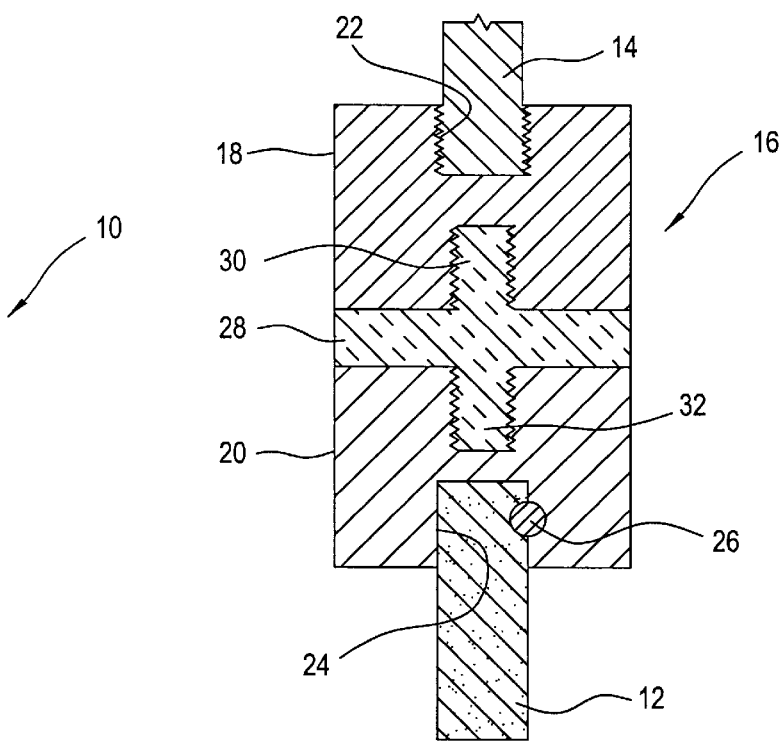
FIG. 2 is a side cross section of one embodiment of a seed chuck according to this invention.

A seed chuck 16 according to this invention is shown in FIG. 2. The main body of seed chuck 16 includes an upper part 18 and a lower part 20, both made of materials typically used for a seed chucks, such as carbon, specifically graphite. The main body of seed chuck 16 is generally cylindrically shaped with a dipping support formation 22 on one end that engages the attachment member 14 of the crystal pulling apparatus. The formation is shown as a threaded opening to which the end of attachment member 14 can be releaseably retained. However, any known form of attachment such as a snap-fit or a clamping arrangement can be used.

At the opposite end of the main body of seed chuck 16 as viewed in FIG. 2, a seed support formation 24 is located. As seen in FIG. 2, seed support formation 24 is formed as a depression in seed chuck 16 shaped to accept seed crystal 12. For purposes of illustration, seed crystal 12 is shown being supported by a seed pin 26, as is conventionally known. However, any known method of retaining a seed crystal in a seed chuck could be used in this invention, including various types of releasable clamping devices.

A shield 28 is coupled to seed chuck 16 to form a thermal barrier adjacent seed crystal 12. As seen in FIG. 2, shield 28 is formed of an insulating insert connected to upper part 18 and lower part 20 of seed chuck 16. Any known insulating material can be used for the shield 28, such as a ceramic, molybdenum, or carbon composite material. Shield 28 is secured to seed chuck 16 by an upper fastening flange 30 and a lower fastening flange 32. Fastening flanges 30 and 32 are shown as threaded members that releaseably engage upper part 18 and lower part 20 of seed chuck 16, respectively. Alternatively, flanges 30 and 32 could be configured as snap-fit fasteners or rotatably retained fasteners, including any type of known fastener that would create a secure connection between seed chuck 16 and shield 28. Also, flanges 30 and 32 could be configured as an elongated fastening member, with shield 28 configured as an insulating washer disposed around elongate fastener 30, 32.

Figure 3:
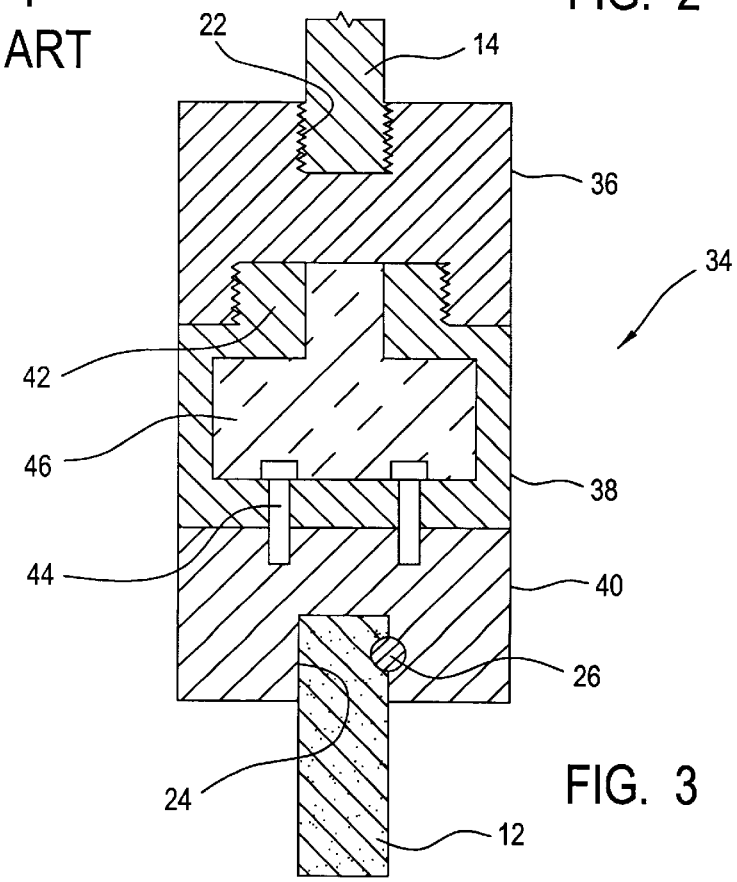
FIG. 3 is a side cross section of a modification of a seed chuck according to this invention.

FIG. 3 shows a modification of the seed chuck of FIG. 2 and includes seed chuck 34 having three portions, including first portion 36, second portion 38 and third portion 40. First portion 36 includes dipping support formation 22 that releasably engages attachment member 14 as described with respect to FIG. 2. Second portion 38 forms the shield. Third portion 40 includes seed support formation 24 that releasably engages seed crystal 12 by seed pin 26, also as described with respect to FIG. 2.

Second portion 38 is connected to first portion 36 by a fastening flange 42, shown as a threaded extension in FIG. 3. Similar to upper fastening flange 30 of FIG. 2, fastening flange 42 may be configured as any type of known fastening member that provides a secure connection, such as a snap-fit or rotatably secured fastening member. Second portion 38 is secured to third portion 40 by a plurality of fasteners 44. Fasteners 44 can be any conventional fastener, such as a screw, set screw, key, snap-fit, or other similar known types of conventional fasteners. The fasteners 44 can be accessed through the interior of second portion 38 if desired. Preferably, at least two fasteners 44 are used to prevent third portion 40 from rotating with respect to second portion 38 during the pulling/dipping seed crystal growth process. Second portion 38 could also be configured to have a lower fastening flange similar to fastening flange 42.

Second portion 38 is made as a hollow tube and has a closed end for attachment purposes. The hollow tube portion can be used vacant or filled with an insulation 46, which preferably has thermal insulating characteristics to create a thermal barrier between first portion 36 and third portion 40 in order to thermally isolate seed crystal 12. Insulation 46 may be a ceramic, a rigid foam, or a loose fill type insulation. Preferably, the hollow interior of second portion 38 is open to the top as shown in FIG. 3, to directly abut first portion 36 in order to minimize heat transfer. Even when the hollow tube portion is vacant, the air space serves as an insulator to stop thermal conduction. In this way, second portion 38 functions as a thermal shield for seed crystal 12.

Figure 4:
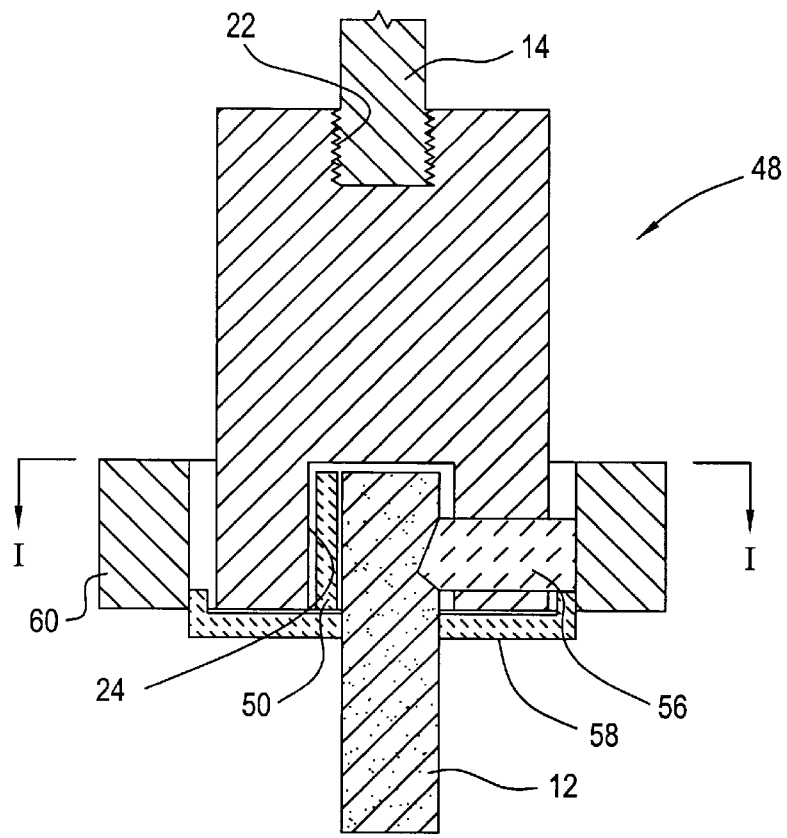
FIG. 4 is a side cross section of another embodiment of the invention.
Figure 5:
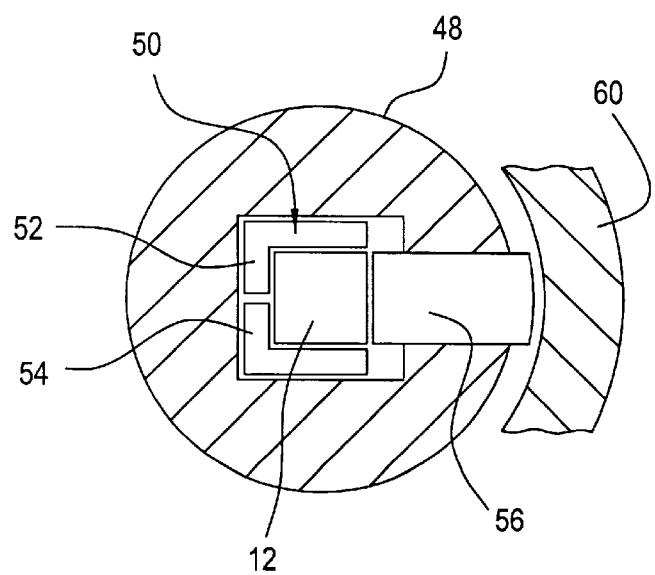
FIG. 5 is a top cross section of FIG. 4 taken along line I—I.

FIG. 4 shows a seed chuck 48 having a shield 50 disposed between seed crystal 12 and the main body of seed chuck 48 within seed support formation 24. Shield 50 is formed as a plurality of inserts, for example 52 and 54 shown in FIG. 5, that form a thermal barrier between seed crystal 12 and the main body of seed chuck 48. Inserts 52 and 54 are shown as L-shaped members that closely surround seed crystal 12. However, a single insert shaped to fit securely around seed crystal 12 or a plurality of individual inserts on each side of seed crystal 12, for example, could be utilized with the same effect. Any shape or form of insert can be used positioned adjacent the seed crystal, even loosely, to shield or insulate the seed crystal.

As seen in FIG. 4, seed crystal 12 is held within seed support formation 24 by a releasable wedge 56 that is inserted through the main body of seed chuck 48 into abutting engagement with seed crystal 12. Wedge 56 is also made of insulating material, similar to insert shield 50, such as ceramic or other conventional rigid insulating materials. Shield 50 is held within seed support formation 24 by a retaining disk 58, also made of insulating material, such as ceramic, that fits closely around seed crystal 12 and abuts a bottom portion of seed chuck 48. Retaining disk 58 securely holds inserts 52 and 54 in place while also forming a thermal barrier from seed chuck body 48. A slideable ring 60 is releasably secured over the main body of seed chuck 48 to hold retaining disk 58 and wedge 56 in place. The retaining assembly of shield 50 also acts as a barrier to external gas flow, which if permitted to reach seed crystal 12 would act as a cooling influence. Slideable ring 60 and retaining disk 58 create a deflecting shield that divert any external gases to which seed chuck 48 is subjected to away from seed crystal 12.

Figure 6:
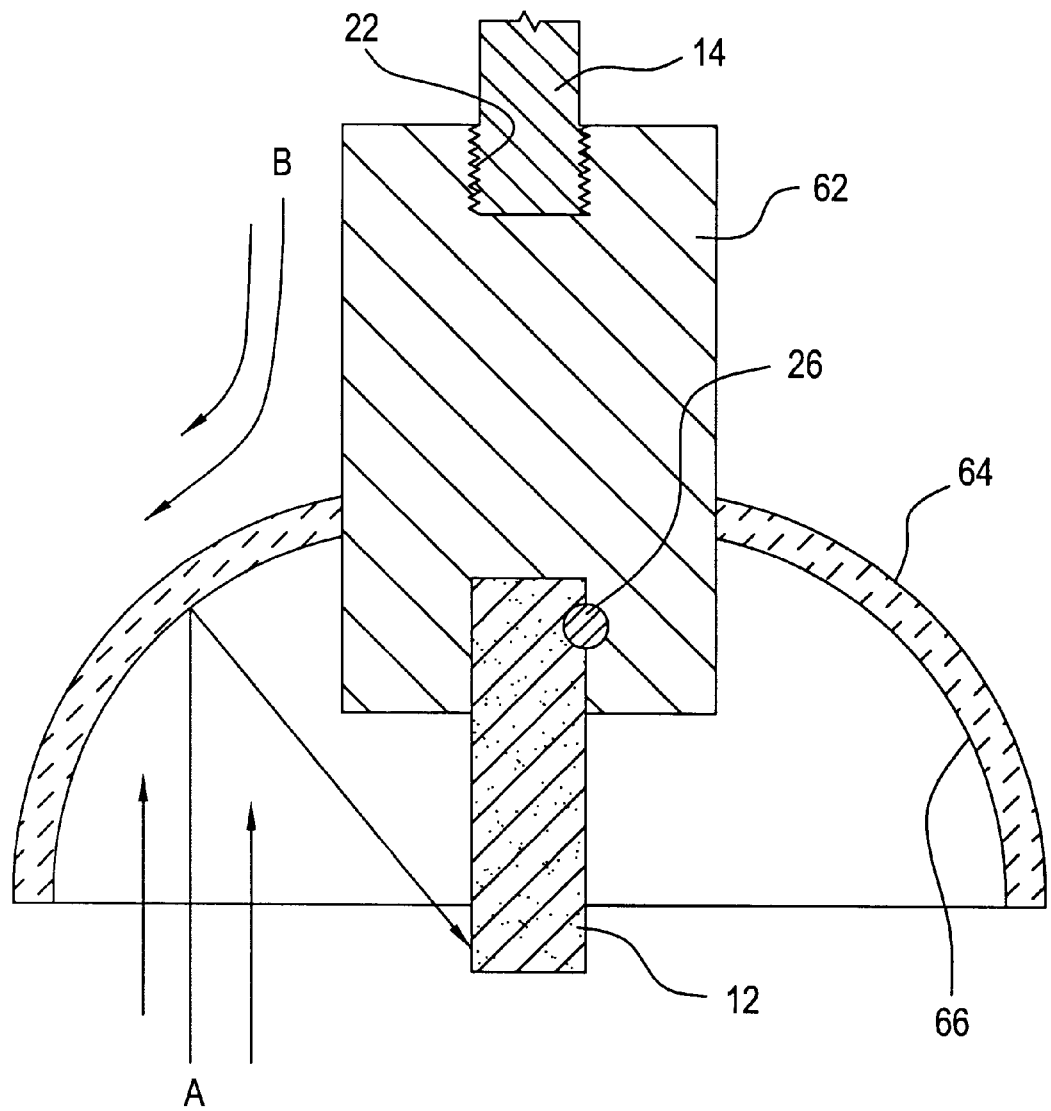
FIG. 6 is a side cross section of an additional embodiment of the invention.

FIG. 6 shows another seed chuck 62 and shield 64 arrangement according to this invention. In this arrangement, a removable and adjustable shield 64 is attached to the exterior surface of seed chuck 62. Preferably, shield 64 is configured as an inverted cup or parabolic dome shape. Shield 64 fits around the circumference of seed chuck 62 and is movable upward and downwardly as shown in FIG. 6 to and from seed crystal 12. The advantage of shield 64 is that seed chuck 62 requires no modification as shield 64 is held by friction onto seed chuck 62. Shield 64 acts to deflect external gases shown as arrow B in FIG. 6, such as Argon which is typically used during the growth process, from reaching seed crystal 12 and cooling it. Shield 64 also acts to capture heat radiating from the melt and uses existing emissive, reflective and conductive heat from the melt, as shown with arrows A. The shape of shield 64 can be modified to concentrate heat reflected from inner surface 66 of shield 64 onto a particular location of seed crystal 12. The angle or curvature of inner surface 66 can concentrate heat onto a particular focal point, preferably at the tip of seed crystal 12. Inner surface 66 of shield 64 can be coated with a reflective and/or insulative substance such as silicon carbide or silicon nitride, which may be polished if desired. Similarly, the outer surface of shield 64 can be coated with insulating material to prevent external gases B from cooling shield 64. Shield 64 can be made of any type of material including carbon and/or ceramic. Shield 64 creates a zone directly around seed crystal 12 in which the ambient temperature is dramatically increased due to the heat irradiating from the melt so that the temperature of seed crystal 12 stabilizes to a temperature close to the melt prior to dipping.

Each of the above described shields act to raise the temperature of the seed crystal to thereby lessen the effect of the thermal gradient between the seed crystal and the melt. By lessening the effect of the thermal gradient, thermally induced stresses are reduced and in certain situations eliminated when the seed crystal is dipped into the normally much hotter melt. The above described shields minimize the heat sink effect of the seed chuck and the cooling effects of external gas flow while having an active warming effect on the seed crystal using the energy from the melt. By this, no additional external warming sources are needed. Thus, an efficient crystal pulling process can be attained. Thermal isolation of the silicon seed crystal also eliminates the need for the use of the Dash method necking procedure to remove seed dislocations. The resultant seed crystal 12 grown according to the process described herein drastically reduces thermally induced stress dislocations.

According to the process of using the shield of this invention, seed crystal 12 is thermally isolated from seed chuck 36 by one or more shields 28, 38, 50, and/or 64. The seed crystal is held above the hot silicon melt to allow the temperature of the seed crystal 12 to stabilize. Heat radiating from the melt is used to passively heat seed crystal 12 while external gases are deflected away form seed crystal 12 to prevent cooling. By this method, the temperature of seed crystal 12 is quickly stabilized and closely reaches the temperature of the hot melt.

While advantageous embodiments have been chosen to illustrate the invention, it will be understood by those skilled in the art that various changes and modifications can be made therein without departing from the scope of the invention as defined in the appended claims.

What is claimed is:

1. A method of warming a seed crystal during a growth process in which a portion of the seed crystal is dipped into a hot melt, comprising the steps of:

providing a hot melt consisting of a molten mass of material;

supporting a seed crystal in a seed chuck for selectively lowering the seed crystal into the hot melt; and warming the seed crystal supported in the seed chuck by using heat radiating from the hot melt and by insulating the seed crystal from external cooling forces that include the seed chuck.

2. The method of claim 1, wherein the step of warming the seed crystal includes capturing and controlling emissive, reflective and conductive heat from the hot melt.

3. The method of claim 1, wherein the step of warming the seed crystal includes directing heat radiating from the hot melt onto a selected portion of the seed crystal.

4. The method of claim 3, wherein the step of directing heat radiating from the hot melt includes forming a shield with an inner curved surface that reflects heat radiating from the hot melt at an angle onto a side surface of the seed crystal.

5. The method of claim 1, wherein the step of warming the seed crystal includes insulating a portion of the seed chuck that contacts the seed crystal to prevent thermal transfer from the seed chuck to the seed crystal.

6. The method of claim 1, wherein the step of warming the seed crystal includes spacing the seed crystal from the seed chuck with an insulating insert.

* * * * *